(12) United States Patent
Jayaraman (10) Patent No.: US 10,917,966 B2
(45) Date of Patent: Feb. 9, 2021

(54) ARTICLES INCLUDING METALLIZED VIAS

(71) Applicant: Corning Incorporated, Corning, NY (US)

(72) Inventor: Shrisudersan Jayaraman, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/245,793

(22) Filed: Jan. 11, 2019

(65) Prior Publication Data

US 2019/0239353 A1 Aug. 1, 2019

Related U.S. Application Data

(60) Provisional application No. 62/623,072, filed on Jan. 29, 2018.

(51) Int. Cl.
| | |
|---|---|
| *H05K 1/09* | (2006.01) |
| *H05K 1/11* | (2006.01) |
| *H01L 23/15* | (2006.01) |
| *H01L 21/48* | (2006.01) |
| *H01L 23/14* | (2006.01) |
| *H01L 23/498* | (2006.01) |
| *H05K 1/03* | (2006.01) |
| *H05K 3/16* | (2006.01) |
| *H05K 3/38* | (2006.01) |
| *H05K 3/42* | (2006.01) |

(52) U.S. Cl.
CPC ............ *H05K 1/115* (2013.01); *H01L 21/486* (2013.01); *H01L 23/145* (2013.01); *H01L 23/15* (2013.01); *H01L 23/49827* (2013.01); *H05K 1/0306* (2013.01); *H05K 1/09* (2013.01); *H05K 3/16* (2013.01); *H05K 3/388* (2013.01); *H05K 3/423* (2013.01)

(58) Field of Classification Search
CPC ........................................................ H05K 1/115
USPC ............................................................ 174/258
See application file for complete search history.

(56) References Cited

U.S. PATENT DOCUMENTS

| | | | |
|---|---|---|---|
| 5,814,889 | A | 9/1998 | Gaul |
| 6,472,023 | B1 | 10/2002 | Wu et al. |
| 6,503,343 | B1 | 1/2003 | Tench et al. |

(Continued)

FOREIGN PATENT DOCUMENTS

| | | |
|---|---|---|
| CN | 101226891 A | 7/2008 |
| CN | 102537064 A | 7/2012 |

(Continued)

OTHER PUBLICATIONS

US 9,190,356 B2, 11/2015, Ebefors et al. (withdrawn)

(Continued)

*Primary Examiner* — Stanley Tso
(74) *Attorney, Agent, or Firm* — Amy T. Lang; Kevin L. Bray (57) ABSTRACT

An article includes a wafer having a body which defines a first surface and a second surface. The wafer defines a via having a via surface extending between the first and second surfaces through the body. An adhesion layer is positioned on the via surface. At least a portion of the via surface is free of the adhesion layer. A metallic component is positioned within the via and extends from the first surface to the second surface.

21 Claims, 4 Drawing Sheets

(56) References Cited

U.S. PATENT DOCUMENTS

| | | |
|---|---|---|
| 6,627,066 B1 | 9/2003 | Isayama et al. |
| 6,699,798 B2 | 3/2004 | Rockford |
| 6,703,712 B2 | 3/2004 | Gilkes et al. |
| 6,802,946 B2 | 10/2004 | Basol et al. |
| 6,928,726 B2 | 8/2005 | Zollo et al. |
| 7,220,347 B2 | 5/2007 | Isono et al. |
| 7,754,061 B2 | 7/2010 | Basol |
| 7,863,189 B2 | 1/2011 | Basker et al. |
| 8,811,061 B2 | 8/2014 | Tsuji et al. |
| 8,883,640 B1 | 11/2014 | Patton et al. |
| 9,093,506 B2 | 7/2015 | Shen |
| 9,231,068 B2 | 1/2016 | Shen |
| 9,232,652 B2 | 1/2016 | Fushie et al. |
| 9,240,373 B2 | 1/2016 | Ebefors et al. |
| 9,240,392 B2 | 1/2016 | Hurwitz et al. |
| 9,278,886 B2 | 3/2016 | Boek et al. |
| 9,517,963 B2 | 12/2016 | Marjanovic et al. |
| 9,607,822 B2 | 3/2017 | Buckalew et al. |
| 9,806,006 B2 | 10/2017 | Li et al. |
| 10,383,572 B2* | 8/2019 | Knickerbocker ........ A61B 5/68 |
| 2001/0024872 A1 | 9/2001 | Miyamoto |
| 2002/0039464 A1 | 4/2002 | Yoshimura et al. |
| 2003/0000846 A1 | 1/2003 | Rzeznik et al. |
| 2003/0089986 A1 | 5/2003 | Gilkes et al. |
| 2004/0003894 A1 | 1/2004 | Hsu et al. |
| 2004/0170753 A1 | 9/2004 | Basol |
| 2004/0187731 A1 | 9/2004 | Wang et al. |
| 2005/0121317 A1 | 6/2005 | Klocke et al. |
| 2005/0151824 A1 | 7/2005 | Iwamatsu et al. |
| 2006/0046432 A1 | 3/2006 | Sankarapillai et al. |
| 2006/0046455 A1 | 3/2006 | Nitta et al. |
| 2006/0081477 A1 | 4/2006 | Basol |
| 2007/0051635 A1 | 3/2007 | Basol |
| 2007/0202686 A1 | 8/2007 | Dixit et al. |
| 2011/0284495 A1 | 11/2011 | Li et al. |
| 2012/0013012 A1 | 1/2012 | Sadaka et al. |
| 2012/0064717 A1 | 3/2012 | Kato et al. |
| 2012/0080214 A1 | 4/2012 | Weaver et al. |
| 2012/0080762 A1 | 4/2012 | Foster et al. |
| 2013/0062210 A1 | 3/2013 | Fushie et al. |
| 2013/0299985 A1 | 11/2013 | Shen |
| 2013/0313121 A1 | 11/2013 | Yu et al. |
| 2014/0199519 A1 | 7/2014 | Schillinger et al. |
| 2015/0028479 A1 | 1/2015 | Ebefors et al. |
| 2015/0083469 A1* | 3/2015 | Sunohara ........ H01L 23/49827 174/255 |
| 2015/0102498 A1 | 4/2015 | Enicks et al. |
| 2015/0115393 A1 | 4/2015 | Shen |
| 2015/0120498 A1 | 4/2015 | Carney et al. |
| 2015/0262874 A1 | 9/2015 | Van't Oever et al. |
| 2015/0311154 A1* | 10/2015 | Sunohara ........ H01L 23/49827 257/774 |
| 2016/0020146 A1 | 1/2016 | Shen |
| 2016/0113119 A1 | 4/2016 | Cordes et al. |
| 2016/0128202 A1 | 5/2016 | Bellman et al. |
| 2016/0237571 A1 | 8/2016 | Liu et al. |
| 2016/0336179 A1 | 11/2016 | Mizutani et al. |
| 2016/0353584 A1 | 12/2016 | Honda et al. |
| 2017/0156209 A1 | 6/2017 | Wang et al. |
| 2017/0194199 A1* | 7/2017 | Chang ............... H01L 21/76877 |
| 2017/0229565 A1* | 8/2017 | Jun .................... H01L 29/42356 |
| 2017/0287728 A1 | 10/2017 | Dahlberg et al. |
| 2019/0024237 A1 | 1/2019 | Jayaraman |

FOREIGN PATENT DOCUMENTS

| | | |
|---|---|---|
| CN | 102737961 A | 10/2012 |
| CN | 103199054 A | 7/2013 |
| CN | 103594627 A | 2/2014 |
| CN | 104485288 A | 4/2015 |
| CN | 103474510 B | 3/2016 |
| CN | 107240624 A | 10/2017 |
| JP | 2011235532 A | 11/2011 |
| KR | 1020100043811 A | 4/2010 |
| KR | 101124784 B1 | 2/2012 |
| KR | 101221376 B1 | 1/2013 |
| WO | 2014093740 A1 | 6/2014 |
| WO | 2015112958 A1 | 7/2015 |
| WO | 2015157202 A1 | 10/2015 |

OTHER PUBLICATIONS

Jayaraman et al; "Methods for Making Electrodes and Providing Electrical Connections in Sensors" filed as PCT/US2018/067812 on December 28, 2018; 42 pages.

International Search Report and Written Opinion PCT/US2019/015402 dated Jun. 4, 2019, 12 Pgs.

Andricacos; "Copper On-Chip Interconnectons a Breakthrough in Electrodeposition to Make Better Chips"; The Electrochemical Society Interface, Spring 1999; pp. 32-37.

Cao et al; "Wafer-Level Package With Simultaneous TSV Connection and Cavity Hermetic Sealing by Solder Bonding for MEMS Device"; IEEE Transactions on Electronics Packaging Manufacturing; vol. 32; No. 3; (2009) pp. 125-132.

Carano, "Via hole filling technology for high density, high aspect ratio printed wiring boards using a high Tg, low CTE plugging paste," IPC Printed Circuits Expo, APEX and the Designers Summit, 2007, vol. 3. pp. 1729-1739.

Demirkiran et al; "Recovering of Copper With Metallic Aluminum"; Trans. Nonferrous Met. Soc. China; 21 (2011) pp. 2778-2782.

Kunces; "Chemical Deposition of Metallis Films From Aqueous Solutions"; Electroless Plating: Fundamentals and Applications; Chapter 19; pp. 511-517; (1990.

Kutchoukov Et La; "Through-Wafer Interconnect Technology for Silicon"; J. Micromech. Microeng. 14 (2004) pp. 1029-1036.

Lee et al; "Through-Glass Copper Via Using the Glass Reflow and Seedless Electroplating Processes for Wafer-Level RF MEMS Packaging"; J. Micromech. Microeng.; 23; (2013) 085012; 10 Pages.

Liu et al; "Electroless Nickel Plating on AZ91 Mg Alloy Substrate"; Surface & Coatings Technology; 200 (2006) pp. 5087-5093.

Moffat et al; "Electrochemical Processing of Interconnects"; Journal of the Electrochemical Society; 160 (12) Y7-Y10 (2013.

Nguyen et al; "Through-Wafer Copper Electorplating for Three-Dimensional Interconnects"; J. Micromach. Microeng. 12 (2002) pp. 395-399.

Ogutu et al; "Hybrid Method for Metallization of Glass Interposers"; Journal of the Electrochemical Society; 160 (12) D3228-D3236 (2013.

Ogutu et al; "Superconformal Filling of High Aspect Ratio Through Glass Vias (TGV) for Interposer Applications Using TNBT and NTBC Additives"; Journal of the Electrochemical Society; 162 (9) D457-D464 (2015.

Pearson et al; "The Effect of Pulsed Reverse Current on the Polarization Behaviour of Acid Copper Plating Solutions Containing Organic Additives"; Journal of Applied Electrochemistry, 20 (1990) 196-208.

Song et al; "Bottom-Up Copper Electroplating Using Transfer Wafers for Fabrication of High Aspect-Ratio Through-Silicon-Vias"; Microelectronic Engineering; 87 (2010) 510-513.

Vaillancourt et al. "Adhesive Technology: Surface preparation techniques on aluminum," Worcester Polytechnic Institute (WPI) 2009, 171 pgs.

Vanysek; "Electrochemical Series"; CRC Handbook of Chemisty and Physics; 92nd Edition 2011-2012; 12 Pages.

Wolf et al; "High Aspect Ratio TSV Copper Filling With Different Seed Layers"; IEEE; 2008 Electronic Components and Technology Conference; pp. 563-570.

Xu et al; "Direct Copper Plating on Ultra-Thin Sputtered Cobalt Film in an Alkaline Bath"; Journal of the Electrochemical Society, 160 (12) D3075-D3080 (2013.

Zoschke et al. "Polyimide based temporary wafer bonding technology for high temperature compliant TSV backside processing and thin device handling", SUSS Report, Feb. 2012, 11 pgs.

(56) References Cited

OTHER PUBLICATIONS

Chinese Patent Application No. 201580072215.7; English Translation of the Office Action dated Jan. 6, 2020; China Patent Office; 13 Pgs.

* cited by examiner

ARTICLES INCLUDING METALLIZED VIAS

This application claims the benefit of priority to U.S. Provisional Application Ser. No. 62/623,072 filed on Jan. 29, 2018, the content of which is relied upon and incorporated herein by reference in its entirety.

FIELD OF THE DISCLOSURE

The present disclosure relates to vias through articles, and more specifically, to metallized vias through articles.

BACKGROUND

Through hole connections enable thin silicon via (TSV) and thin glass via (TGV) based technologies that provide high packaging density, reduced signal path, wide signal bandwidth, lower packaging cost and miniaturized systems. Conventional processes available for filling vias with copper include paste-fill process and electroplating processes.

The paste process consists of filling the vias with a paste containing copper and a suitable binder, followed by high-temperature curing. The high-temperature curing poses the risk of breaking or bending thin substrates through which the TSV or TGV is formed. Additionally, there is a need to manage the coefficient of thermal expansion (CTE) of the paste as a CTE mismatch between the paste and the substrate may damage the paste and/or the substrate during the high-temperature curing.

Conventional electroplating processes which fill TSVs or TGVs require the deposition of a barrier layer and an electrically conductive seed layer in order to facilitate the electrodeposition of a metal. The electrically conductive seed layer must be uniformly applied to the whole via to form an acceptable metalized via. In conventional electrodeposition of vias, surfaces of the via which do not have the seed layer, or are otherwise free of the seed layer, tend to create voids in the metal owing to the lack of a conductive surface on which to electrodeposit the metal. The voids in the metal of the TSV or TGV generally render the TSV or TGV unusable.

Securing of the metal within the via after electrodeposition is also challenging. Post-formation processing of the via may result in the metal within the via falling out or becoming damaged due to mechanical forces acting the metal and/or due to stresses created by a CTE mismatch between the metal and the substrate.

Accordingly, new methods of metallizing vias and securing the metal within the vias may be advantageous.

SUMMARY OF THE DISCLOSURE

According to at least one feature of the present disclosure, an article includes a wafer having a body which defines a first surface and a second surface. The wafer defines a via having a via surface extending between the first and second surfaces through the body. An adhesion layer is positioned on the via surface. At least a portion of the via surface is free of the adhesion layer. A metallic component is positioned within the via and extends from the first surface to the second surface.

According to another feature of the present disclosure, a glass article includes a wafer having a body which defines a first surface and a second surface. The wafer defines a via having a via surface extending between the first and second surfaces through the body. An adhesion layer is positioned on the via surface. The adhesion layer is disposed on the via surface in a discontinuous manner. A metallic component is positioned within the via and extends from the first surface to the second surface.

According to another feature of the present disclosure, a method of forming a metallized article, comprises the steps: forming a via through a body of a glass wafer such that the via has a via surface; applying an adhesion layer to the via surface such that a portion of the via surface is free of the adhesion layer; and depositing a metal within the via in contact with the via surface and the adhesion layer.

These and other features, advantages, and objects of the present disclosure will be further understood and appreciated by those skilled in the art by reference to the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION

Additional features and advantages of the invention will be set forth in the detailed description which follows and will be apparent to those skilled in the art from the description, or recognized by practicing the invention as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other.

Figure 1:
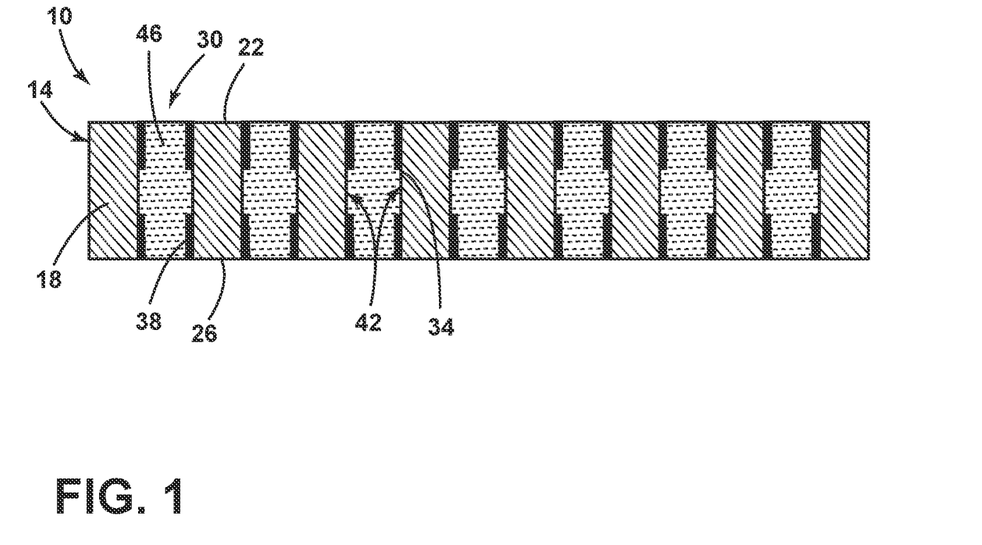
FIG. 1 is a cross-sectional view of an article, according to at least one example.

Referring now to FIG. 1, depicted is an article 10 including a wafer 14 having a body 18 which defines a first surface 22 and a second surface 26. The wafer 14 defines a via 30 having a via surface 34 extending between the first and second surfaces 22, 26 through the body 18. An adhesion layer 38 is positioned on the via surface 34. According to various examples, at least a portion 42 of the via surface 34 is free of the adhesion layer 38. In other words, the portion 42 which is free of the adhesion layer 38 is not in contact with the adhesion layer 38. A metallic component 46 is positioned within the via 30 and extends from the first surface 22 to the second surface 26 within the via 30. As the metallic component 46 is positioned within the via 30, the article 10 may be referred to as a metallized article 10 or the via 30 may be referred to as a metallized via 30.

Figure 2:
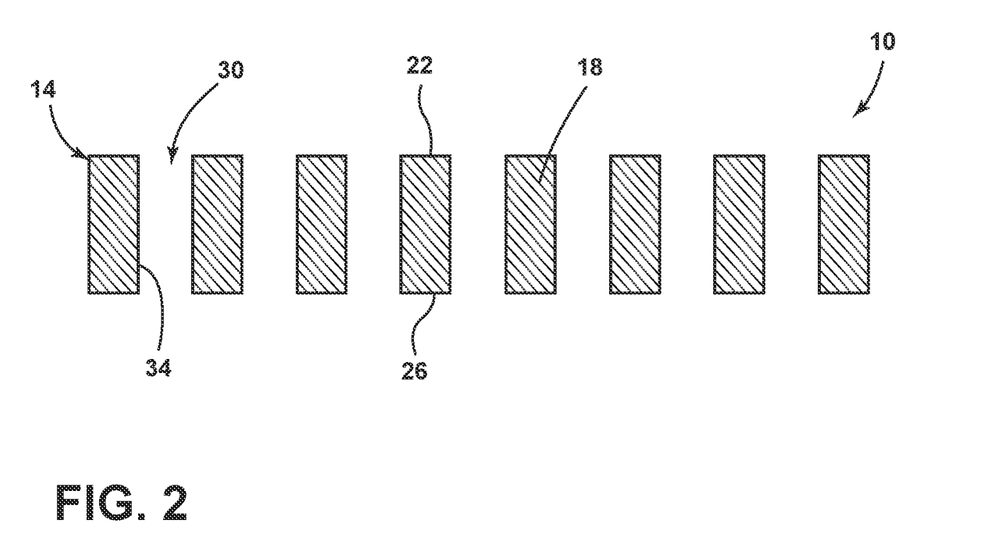
FIG. 2 is a cross-sectional view of a wafer defining a plurality of vias, according to at least one example.

Referring now to FIG. 2, the wafer 14 has the body 18 which defines the first and second surfaces 22, 26. It will be understood that the wafer 14 and/or body 18 may further define one or more minor surfaces positioned along edges thereof. The wafer 14 may be a substantially planar sheet, although other examples of the article 10 may utilize a curved or otherwise shaped or sculpted wafer 14. Further, the wafer 14 may vary in thickness, width and/or length across the wafer 14 without departing from the teachings provided herein.

According to various examples, the wafer 14 may be composed of an electrically insulating material. For example, the wafer 14 may be composed of a glass material, a glass-ceramic material, a ceramic material, silicon-based semiconductor material, a polymeric material and/or combinations thereof. Glass-based examples of the wafer 14 may include soda lime glass, float glass, fluoride glass, aluminosilicate glass, phosphate glass, borate glass, borosilicate glass, chalcogenide glass, aluminum oxide, silicon having an oxidized surface, alkali aluminosilicate glass, alkali containing borosilicate glass, alkali aluminoborosilicate glass and/or combinations thereof. In glass examples of the wafer 14, the wafer 14 may be strengthened or strong. For instance, glass examples of the wafer 14 may be thermally tempered (e.g., for strong wafers 14) or have an ion-exchanged region (e.g., for strengthened wafers 14). Further, the wafer 14 may include a sapphire material. In ceramic examples of the wafer 14, the wafer 14 may be at least partially composed of alumina, beryllia, ceria, zirconia oxides, barium-based ceramics (e.g., $BaTiO_3$) and/or combinations thereof. Further, ceramic examples of the wafer 14 may include non-oxide ceramics such as carbides, borides, nitrides and silicides. In polymeric examples of the wafer 14, the wafer 14 may be at least partially composed of thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic resins, phenolic resins, melamine resins, silicone resins and/or combinations thereof.

The wafer 14 may be substantially translucent, clear, transparent and/or free from light scattering. For example, the wafer 14 may be optically transparent to light having a wavelength in the range of between about 100 nanometers and about 1,200 nanometers, or in a range of about 250 nanometers to about 1,100 nanometers. In some examples, the transmission of light through the wafer 14 may be dependent on the wavelength of the light. For example, the wafer 14 may be optically opaque or translucent over a visible wavelength band (e.g., from about 400 nm wavelength to about 700 nm wavelength) while substantially or fully transmissive at non-visible wavelengths or vice versa.

According to various examples, the wafer 14 can have a thickness (i.e., as measured from the first surface 22 to the second surface 26) ranging from about 50 μm to about 5 mm. Exemplary thicknesses of the wafer 14 range from about 1 μm to about 1000 μm, or from about 100 μm to about 1000 μm or from about 100 μm to about 500 μm. For example, the wafer 14 may have a thickness of about 1 μm, about 5 μm, about 10 μm, about 20 μm, about 30 μm, about 40 μm, about 50 μm, about 60 μm, about 70 μm, about 80 μm, about 90 μm, about 100 μm, about 200 μm, about 300 μm, about 400 μm, about 500 μm, about 600 μm, about 700 μm, about 800 μm, about 900 μm, about 1000 μm, about 2000 μm, about 3000 μm, about 4000 μm or about 5000 μm. Additionally or alternatively, the thickness of the wafer 14 may vary along one or more of its dimensions for aesthetic and/or functional reasons. For example, the edges of the wafer 14 may be thicker as compared to more central regions of the wafer 14, or vice versa. The length, width and thickness dimensions of the wafer 14 may also vary according to the application or use of the article 10.

The body 18 of the wafer 14 defines or includes the vias 30. The wafer 14 may define a single via 30 or may define a plurality of vias 30. The vias 30 may be defined at predetermined locations around the wafer 14 and/or may be positioned randomly. For example, the vias 30 may form a pattern, indicia and/or text. According to various examples, the pattern of the vias 30 may correspond to an electrical circuit or chip. The vias 30 and/or the body 18 define the via surfaces 34 which extends around the vias 30. The vias 30 may have an irregular, circular, oval, triangular, square, rectangular, or higher order polygon cross-sectional shape. It will be understood that the vias 30 may have different cross-sectional shapes than one another without departing from the teachings provided herein. As the vias 30 extend through the body 18 of the wafer 14, the vias 30 may have the same length as the thickness of the body 18. In other words, the vias 30 may have a length of about 1 µm, about 5 µm, about 10 µm, about 20 µm, about 30 µm, about 40 µm, about 50 µm, about 60 µm, about 70 µm, about 80 µm, about 90 µm, about 100 µm, about 200 µm, about 300 µm, about 400 µm, about 500 µm, about 600 µm, about 700 µm, about 800 µm, about 900 µm, about 1000 µm, about 2000 µm, about 3000 µm, about 4000 µm or about 5000 µm. It will be understood that in examples where the thickness of the wafer 14 changes with position, the vias 30 may also change in length such that different vias 30 have different lengths.

The diameter, or longest length dimension in a cross-sectional plane, of the vias 30 may be from about 1 µm to about 300 µm, or from about 5 µm to about 200 µm, or from about 10 µm to about 100 µm. For example, the vias 30 may have a diameter of about 10 µm, about 20 µm, about 30 µm, about 40 µm, about 50 µm, about 60 µm, about 70 µm, about 80 µm, about 90 µm or about 99 µm. It will be understood that the diameter of the via 30 may vary across the length of the via 30. In other words, one or more of the vias 30 may be tapered. It will be understood that the vias 30 may have different diameters or different degrees of tapering than one another.

The vias 30 may have an aspect ratio (e.g., expressed as the proportional relationship between the length of the via 30 to the width of the via 30) of from about 1:1 to about 30:1, or from about 2:1 to about 20:1, or from about 3:1 to about 15:1. For example, the vias 30 may have an aspect ratio of about 1:1 or greater, about 2:1 or greater, about 3:1 or greater, about 4:1 or greater, about 5:1 or greater, about 6:1 or greater, about 7:1 or greater, about 8:1 or greater, about 9:1 or greater, about 10:1 or greater, about 11:1 or greater, about 12:1 or greater, about 13:1 or greater, about 14:1 or greater, about 15:1 or greater, about 16:1 or greater, about 17:1 or greater, about 18:1 or greater, about 19:1 or greater, about 20:1 or greater and all values therebetween. It will be understood that the aspect ratio of the vias 30 may be different from one another or the aspect ratio of the vias 30 may be the same.

According to various examples, one or more of the vias 30 may be formed at an angle between the first and second surfaces 22, 26. In other words, a centerline axis of the vias 30 may not be orthogonal to the first and second surfaces 22, 26. In such examples, a centerline axis of the vias 30 may be at an angle of from about 0° to about 40° from an orthogonal axis of the first and second surfaces 22, 26. It will be understood that the angle of the vias 30 may be different from one another or may be the same.

The vias 30 may be formed in the body 18 of the wafer 14 in a variety of manners. For example, the vias 30 may be formed by first causing laser damage to the wafer 14 followed by a subsequent etching process. During the laser damage process, a pulsed laser may be used to form one or more damage channels within the body 18 of the wafer 14. An exemplary optical setup that enables the creation of the damage channels in the wafer 14 is described in U.S. application Ser. No. 14/154,525 filed on Jan. 13, 2014, the entire contents of which are incorporated by reference as if fully set forth herein.

Through the use of the pulsed laser (e.g., in the form of a Bessel beam), it is possible to create microscopic damage channels in the wafer 14 using one or more high energy pulses or one or more bursts of high energy pulses. The damage channels are regions of the material of the wafer 14 which are modified by the laser. The laser-induced modifications disrupt the structure of the wafer 14 material due to transfer of energy from the laser. Structural disruptions include compaction, melting, dislodging of material, rearrangements, and/or bond scission. The damage channels extend into the interior of the wafer 14 and have a cross-sectional shape consistent with the cross-sectional shape of the laser (e.g., generally circular). In examples where the damage channels have a different shape, the damage channels may be formed via multiple pulses while moving, or translating the wafer 14 and/or laser. Thus, with relative motion between the laser source and the wafer 14, the damage channels can be placed adjacent to one another and in whatever pattern desired.

Additionally or alternatively, the damage channels may be formed in the wafer 14 via laser percussion drilling. Percussion drilling is performed using a laser having a suitable wavelength and intensity, the laser spot size determining the final damage channel size. Wavelengths that may be used range between about 100 nm to about 1070 nm, or in a range of about 150 nm to about 400 nm. According to some examples, the laser may utilize an ultraviolet laser beam having a wavelength of about 355 nm. In yet other examples, the laser may operate at a higher wavelength such as about 1000 nm or greater, about 2000 nm or greater or about 3000 nm or greater.

The laser is pulsed to repetitively strike the same location on the wafer 14. The laser pulse duration is between about 1 ns and about 100 ns, or more specifically between about 10 ns and about 25 ns. In a specific example, the pulsing of the laser beam may have a pulse width of about 100 ps or less. The laser may be capable of from about 50,000 pulses per second to about 150,000 pulses per second. With each pulse, a portion of the material is removed from the wafer 14 and the damage channel begins to form. As the damage channel is formed in the wafer 14, the damage channel confines the laser beam and creates a long thin hole through the wafer 14. The laser is pulsed until the damage channel is of a desired depth within the wafer 14 and the laser is shut off.

An etchant solution may be applied to the wafer 14 after the laser is utilized to form the damage channels in the wafer 14. Use of the etchant solution may preferentially dissolve or remove material from the damage channels relative to the rest of the wafer 14. Application of the etchant solution to the wafer 14 may widen the damage channels to form the vias 30 in the wafer 14. An exemplary etchant of the wafer 14 may include hydrofluoric acid.

Referring now to FIGS. 3A-3E, the article 10 may include the adhesion layer 38. The adhesion layer 38 may be composed of at least one of Ta, Ti, Cr, V, Zr, Mn, W, Fe, Sn, Zn, In, Al and/or combinations thereof. Further, the adhesion layer 38 may include oxides of any of the above-noted constituents. Prior to application of the adhesion layer 38, glass-containing examples of the wafer 14 can be cleaned by immersion into, or an application of, a mixture of 30 wt. % $NH_4OH$, 30 wt. % $H_2O_2$, and water for 30 minutes followed by immersion into a mixture of 35 wt. % HCl, 30 wt. % $H_2O_2$, and water for 30 min. Following the cleaning, the wafer 14 may be rinsed with deionized water.

The adhesion layer 38 may be applied to the wafer 14 through physical vapor deposition (e.g., cathodic arc deposition, electron beam physical vapor deposition, ion plating, ion beam assisted deposition, magnetron sputtering, pulsed laser deposition, sputter deposition, vacuum deposition, vacuum evaporation, evaporation, pulsed electron deposition), chemical vapor deposition (e.g., metalorganic vapor phase epitaxy, electrostatic spray-assisted vapor deposition and/or sherardizing) and/or through solution coating processes (e.g., dip coating, slot coating). After application of the adhesion layer 38, the constituents of the adhesion layer 38 covalently bond with atoms (e.g., oxygen) present within the wafer 14 to couple the adhesion layer 38 to the wafer 14. Once the metallic component 46 is formed within the via 30, the constituents of the adhesion layer 38 form a bond with the metallic component 46 such that the metallic component 46 is coupled with the adhesion layer 38. As such, because the metallic component 46 is bonded to the adhesion layer 38, and the adhesion layer 38 is bonded to the wafer 14, the metallic component 46 is bonded to the wafer 14. Use of the adhesion layer 38 may be advantageous for a variety of reasons. For example, conventional metallized through holes which do not utilize the adhesion layer 38 may rely on the roughness of the via surface 34 to retain the metallic component 46 within the via 30. By utilizing the adhesion layer 38, uncertainties due to routine process variations in the roughness of the via surface 34 can be eliminated and allow the adhesion layer 38 to provide a robust, reliable metallic component 46.

The adhesion layer 38 may have a thickness of from about 1 nm to about 500 nm, or from about 10 nm to about 450 nm, or from about 20 nm to about 400 nm, or from about 25 nm to about 300 nm, or from about 30 nm to about 200 nm or from about 40 nm to about 100 nm. For example, the adhesion layer 38 may have a thickness of about 5 nm, about 10 nm, about 20 nm, about 30 nm, about 40 nm, about 50 nm, about 60 nm, about 70 nm, about 80 nm, about 90 nm, about 100 nm, about 200 nm, about 300 nm, about 400 nm or about 500 nm and all ranges and values therebetween. According to various examples, the thickness of the adhesion layer 38 may vary across the length of the via 30.

The adhesion layer 38 may be applied to the via surface 34, the first surface 22 and/or the second surface 26. In some examples, the adhesion layer 38 extends onto the first and second surfaces 22, 26 after deposition while in other examples the adhesion layer 38 is fully confined to the via surface 34 after deposition. As will be explained in greater detail below, the first and/or second surfaces 22, 26 may be polished to remove the adhesion layer 38 prior to the formation of the metallic component 46.

Figure 3A:
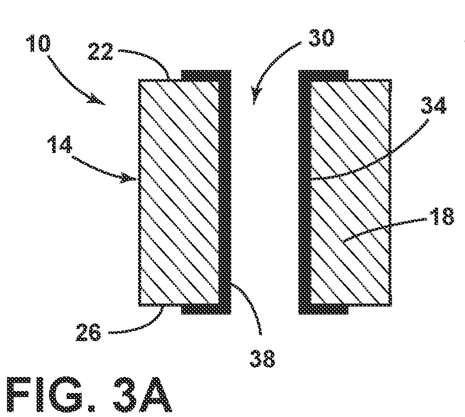
FIG. 3A is a cross-sectional view of the wafer having an adhesion layer, according to at least one example.
Figure 3B:
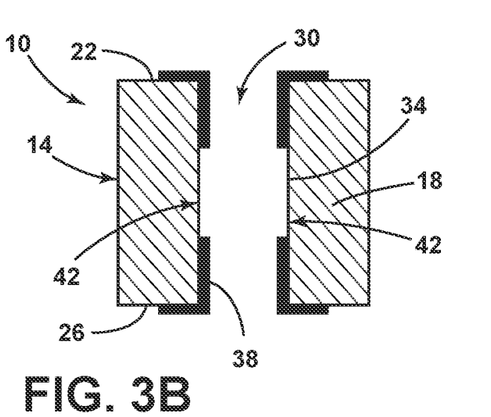
FIG. 3B is a cross-sectional view of the wafer having the adhesion layer, according to at least one example.
Figure 3C:
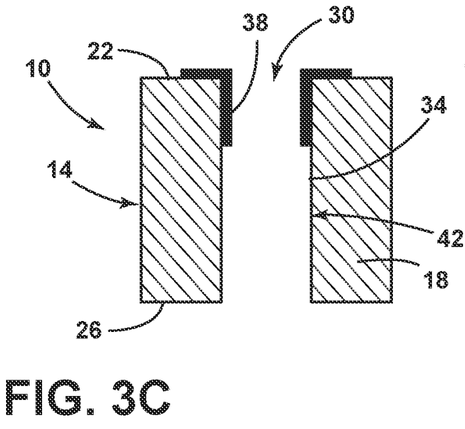
FIG. 3C is a cross-sectional view of the wafer having the adhesion layer, according to at least one example.
Figure 3D:
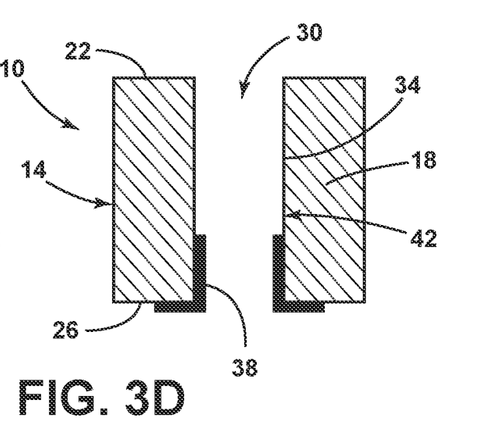
FIG. 3D is a cross-sectional view of the wafer having the adhesion layer, according to at least one example.
Figure 3E:
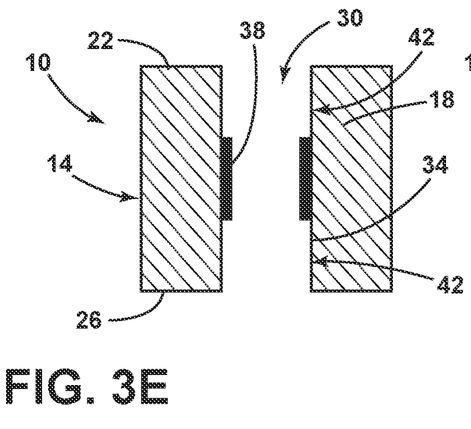
FIG. 3E is a cross-sectional view of the wafer having the adhesion layer, according to at least one example.

The adhesion layer 38 may be applied to the via surface 34 in a variety of manners or patterns. According to some examples, the adhesion layer 38 may be applied to the via surface 34 in a continuous pattern across the length of the via 30 (FIG. 3A). In other words, the entirety of the via surface 34 may be covered with the adhesion layer 38 such that none of the via surface 34 is free of the adhesion layer 38. In the depicted example of FIG. 3A, the entirety of the via surface 34 and portions of the first and second surfaces 22, 26 are covered with the adhesion layer 38.

Figure 3F:
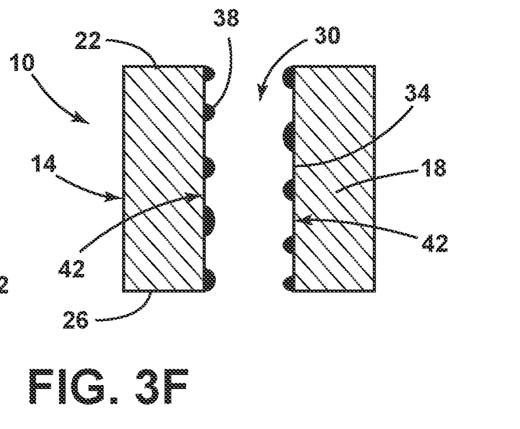
FIG. 3F is a cross-sectional view of the wafer having the adhesion layer, according to at least one example.

According to other examples, the adhesion layer 38 may be applied in a discontinuous manner (e.g., FIGS. 3B and 3F) across the via surface 34 such that one or more portions 42 of the via surface 34 are free of the adhesion layer 38. For purposes of this disclosure, the term "free of the adhesion layer" means that the portions of the via surface 34 in question have little to no appreciable amount of adhesion layer 38. In discontinuous examples of the adhesion layer 38, the portions 42 of the via surface 34 which are free of the adhesion layer 38 separate continuous portions of the adhesion layer 38. For example, in the depicted example of FIG. 3B a central region of the via surface 34 is free of the adhesion layer 38 while end regions of the via surface 34 (e.g., the via surface 34 proximate the first or second surfaces 22, 26) have the adhesion layer 38 applied thereto. Such a feature may be advantageous in solving the problem faced by conventional metallized articles of how to get barriers and seed layers into high aspect ratio vias by not applying any layers to the center region of the via surface 34. In examples where the adhesion layer 38 is applied in a discontinuous manner or pattern to the wafer 14, it may be said that the wafer 14 and/or via surface 34 has a plurality of adhesion layers 38. As explained above, conventional electroplating systems require the deposition of an electrically conductive seed layer with bonding layers such that a discontinuous adhesion layer 38 would not be feasible. Accordingly, the presently disclosed article 10 is capable of having the central region of the via surface 34 be free of such a seed layer. Further, discontinuous examples of the adhesion layer 38 may have the general shape as shown in FIG. 3F where the adhesion layer 38 is segmented into a plurality of nodes or bulges with portions 42 of the via surface 34 which are free of the adhesion layer 38 separating the nodes. The node example of the discontinuous adhesion layer 38 may function to provide "anchoring" points to adhere the metallic component 46 to the via surface 34.

Examples of the adhesion layer 38 which are discontinuous may be advantageous in providing a mechanical lock between the metallic component 46 (FIG. 1) and the via surface 34. For example, as the metallic component 46 is formed, it grows into the portions 42 free of the adhesion layer 38, thereby making direct contact with the via surface 34 and being wedged between the adhesion layers 38 such that relative motion between the metallic component 46 and the wafer 14 (e.g., due to physical or thermal forces acting on the metallic component 46) is resisted. In other words, the portions 42 allow the thickness of the adhesion layer(s) 38 to provide a lip which locks the metallic component 46 in place.

The adhesion layer 38 may also be applied to the wafer 14 in a number of other configurations (e.g., FIGS. 3C-3E) which produce the portions 42 of the via surface 34 which are free of the adhesion layer 38. The adhesion layer 38 may be applied to just a top region (FIG. 3C) of the via surface 34 proximate the first surface 22, just a bottom region (FIG. 3D) of the via surface 34 proximate the second surface 26, or to only to the central region (FIG. 3E) of the via surface 34. It will be understood that the adhesion layer 38 may take any combination of the examples provided in FIGS. 3C-3E. For example, the adhesion layer 38 may extend from a top region of the via surface 34 to the central region, or the adhesion layer 38 may extend from the bottom region proximate the second surface 26 to the central region. It will be understood that each via surface 34 may have a different pattern of adhesion layer 38 than the other vias 30. It will be understood that in some examples, the adhesion layer 38 may be present only on the via surface 34 and that the first and/or second surfaces 22, 26 may be free of the adhesion layer 38. It will be understood that the metallic component 46 is coupled with the adhesion layer 38 and the portion 42 of the via surface 34 which is free of the adhesion layer 38.

Additionally or alternatively, the adhesion layer 38 may be rotationally asymmetric. In such an example, the shape, width, height, pattern and/or thickness of the adhesion layer 38 and portion 42 may vary by location across the via surface 34.

Using the various examples of the adhesion layer 38, various amounts of the via surface 34 may be covered by the adhesion layer 38. For example, about 1% or greater, or about 5% or greater, or about 10% or greater, or about 15% or greater, or about 20% or greater, or about 25% or greater, or about 30% or greater, or about 35% or greater, or about 40% or greater, or about 45% or greater, or about 50% or greater, or about 55% or greater, or about 60% or greater, or about 65% or greater, or about 70% or greater, or about 75% or greater, or about 80% or greater, or about 85% or greater, or about 90% or greater, or about 95% or greater, or about 99% or greater of the via surface 34 is covered by the adhesion layer 38. It will be understood that the adhesion layer 38 may cover any values and/or ranges between these values. In other words, the portion 42 of the via surface 34 which is free of the adhesion layer 38 may be about 1% or greater, or about 5% or greater, or about 10% or greater, or about 15% or greater, or about 20% or greater, or about 25% or greater, or about 30% or greater, or about 35% or greater, or about 40% or greater, or about 45% or greater, or about 50% or greater, or about 55% or greater, or about 60% or greater, or about 65% or greater, or about 70% or greater, or about 75% or greater, or about 80% or greater, or about 85% or greater, or about 90% or greater, or about 95% or greater, or about 99% or greater.

Use of the adhesion layer 38 in conjunction with the vias 30 may be advantageous for a variety of reasons. For example, post metallization (e.g., formation of the metallic component 46 within the via 30) processing of the wafer 14 which does not incorporate the adhesion layer 38 may result in bulging in the metallic component 46, the metallic component 46 being ejected from the via 30 (e.g., due to annealing, thermal shock test and/or to physical force on the component 46) and/or the metallic component 46 delaminating from the via surface 34.

Figure 4:
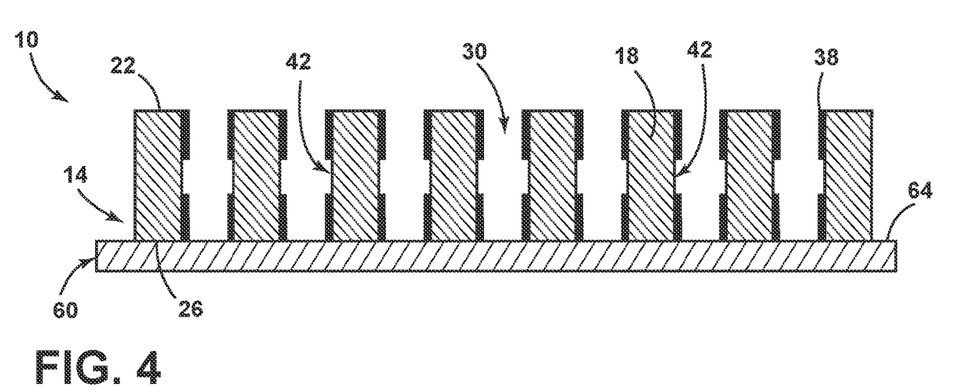
FIG. 4 is a cross-sectional view of the wafer positioned on a growth substrate, according to at least one example.

Referring now to FIG. 4, the electroplating, or bottom-up metallization, process begins with the coupling of a growth substrate 60 to the second surface 26 of the wafer 14. The growth substrate 60 may generally be referred to herein as the substrate 60. The growth substrate 60 defines a growth surface 64 which is in contact with the second surface 26 of the wafer 14. It will be understood that the growth substrate 60 may be coupled to the first surface 22 without departing from the teachings provided herein. The growth substrate 60 provides the growth surface 64 onto which metal ions are deposited during the electroplating process to form the metallic component 46. The growth substrate 60 may be composed of a variety of materials. For example, the growth substrate 60 may be composed of an electrically conductive material to facilitate the deposition of metal during the electroplating process. According to various examples, the growth surface 64 may have a sufficiently low surface roughness to enable detachment of the growth substrate 60 from the metallic component 46 and wafer 14 once the metallic component 46 has been formed. Exemplary materials of the growth substrate 60 include a metal or metal alloy such as copper, stainless steel, titanium, nickel, brass, bronze, Inconel, and/or combinations thereof. According to various examples, the growth substrate 60 may include one or more coatings, films and/or layers positioned over the growth surface 64. In some examples, the growth substrate 60 may be composed of a dielectric material and the growth surface 64 may be coated with one or more electrically conductive coatings or layers. Example dielectric materials of the growth substrate 60 may include rubber, silicon, glass and/or combinations thereof. The one or more electrically conductive coatings or layers positioned on the growth surface 64 may be composed of indium-tin oxide, copper-coated indium-tin oxide, aluminum, aluminum coated indium-tin oxide, titanium, titanium coated indium-tin oxide, nickel, nickel coated indium-tin oxide, niobium coated indium-tin oxide and/or combinations thereof. In yet another example, the growth substrate 60 may be fabricated from an electrically conductive rubber or polymer material having electrically conductive particles embedded therein.

According to various examples, the article 10 and/or adhesion layer 38 may be free of a seed layer. Conventional glass substrates having metallized through holes use seed layers on which to precipitate or grow metal connections during electroplating processes. For example, seed layers are often electrically conductive such that the seed layer functions as an electrode on which to plate the metal during electroplating. In order for the metal to fully fill the through hole, the seed layer must be present throughout the through hole in an unbroken manner. As the article 10 of the present disclosure is formed using a bottom-up electroplating technique, the article 10, wafer 14, via 30, via surface 34 and/or adhesion layer 38 may be free of any seed layer. As such, the via surface 34 may have the portions 42 of the via surface 34 which are free of the adhesion layer 38 as no seed layer is required.

In the depicted example of FIG. 4, the second surface 26 of the wafer 14 is positioned in direct contact with the growth surface 64 of the growth substrate 60. As used herein, the term "direct contact" means that surfaces of the wafer 14 and the substrate 60 are in contact with one another without intervening layers disposed therebetween. The wafer 14 and the growth substrate 60 may be maintained in a coupled relationship by the application of a mechanical force onto the wafer 14, the growth substrate 60, or both. The mechanical force may provide a clamping force such that the second surface 26 of the wafer 14 and the growth surface 64 of the growth substrate 60 remains in direct contact with one another. The mechanical force is sufficient to provide an intimate and leak-free seal between the wafer 14 and the growth substrate 60.

Figure 5:
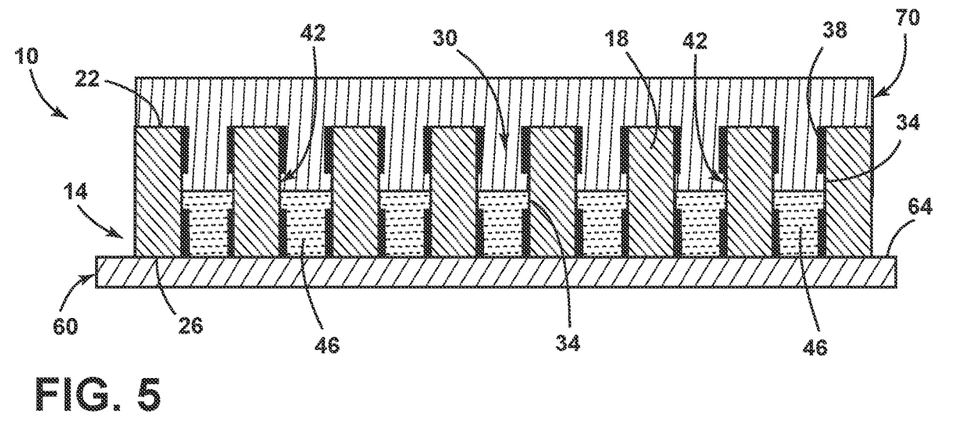
FIG. 5 is a cross-sectional view of the wafer submerged in an electrolyte with an advancing metal deposition front through the vias, according to at least one example.

Referring now to FIG. 5, once the growth surface 64 of the growth substrate 60 has been coupled with the wafer 14, an electrolyte 70 containing ions of the metal to be deposited as the metallic component 46 is introduced into the vias 30 followed by an electrochemical reduction of the ions to metal particles on the growth substrate 60 by applied current and/or voltage. Electrochemical deposition is continued until the vias 30 are filled. The metal ions may be copper, silver, nickel, gold, platinum, lead, cadmium, chromium, rhodium, tin, zinc and/or combinations thereof. The metal ions may be introduced into the electrolyte 70 as sulfates, nitrates, cyanides and/or chlorides. The electrolyte 70 may have a concentration of ions of about 0.0001 M or higher.

The electrolyte 70 is disposed on the wafer 14 such that the electrolyte 70 substantially fills all of the vias 30 that are present within the wafer 14. According to various examples, the electrolyte 70, the wafer 14, and the growth substrate 60 may be maintained within an electroplating cell during the electroplating process. An electrode (i.e., a counter electrode) is positioned within the electrolyte 70. The electrode may be fabricated from an electrically conductive material such as platinum, copper, titanium, nickel, stainless steel, other electrically conductive materials and/or combinations thereof. Current, voltage or a combination thereof is applied between the electrode and the growth surface 64 of the growth substrate 60 to provide a negative constant current to the growth substrate 60. A current density between the electrode and the growth substrate 60 may range from about 0.001 mA/cm² to about 1 A/cm² and a voltage range of about −0.001 V to about −20 V may be provided.

As the current or voltage is applied between the growth substrate 60 and the counter electrode through the electrolyte 70, the metal ions begin to plate at the bottom of the vias 30 onto the growth substrate 60 to form the metallic component 46. As the metal particles begin to plate on the growth surface 64, the vias 30 act as a guide in growing the metallic component 46. At the interface between the electrolyte 70 and the growth surface 64 electrons are transferred to the metal ions to reduce them to the metallic component 46, as shown in Equation (1) below. It will be understood that although Equation (1) is shown utilizing copper, metal ions of different charge may be utilized without departing from the teachings provided herein.

$$Cu_{electrolyte}^{2+} + 2e^- \rightarrow Cu_{solid,substrate} \quad \text{Eq. (1)}$$

The applied current controls the rate of the reduction reaction and therefore the deposition rate may be increased or decreased by increasing or decreasing the applied current. The electroplating process may be performed at a variety of temperatures. For example, the electroplating process may be performed at a temperature of from about 10° C. to about 50° C. Compared to traditional electroplating processes, the disclosed electroplating process is seedless and allows for the plating process to form a metal deposition front that moves uniformly from the bottom (e.g., proximate the second surface 26) of the via 30 to the top of the via 30 (e.g., proximate the first surface 22). As such, the electroplating process may be known as a bottom-up metallization process of the vias 30 or as a bottom-up electroplating process. Conventional seeded electroplating processes require the seed layer from which the metal deposition front will form. As explained above, conventional seed layers must be deposited over the entirety of the via surface 34 with the adhesion layer 38 in order to facilitate deposition of the metal throughout as the seed layer functions as an electrode. As the electroplating process of the present disclosure does not require a seed layer, the adhesion layer 38 does not need to be positioned all over the via surface 34 such that the via surface 34 may form the portions 42 which are free of the adhesion layer 38. Use of the presently disclosed electroplating process may also decrease or eliminate the formation of voids within the metallic component 46.

Figure 6:
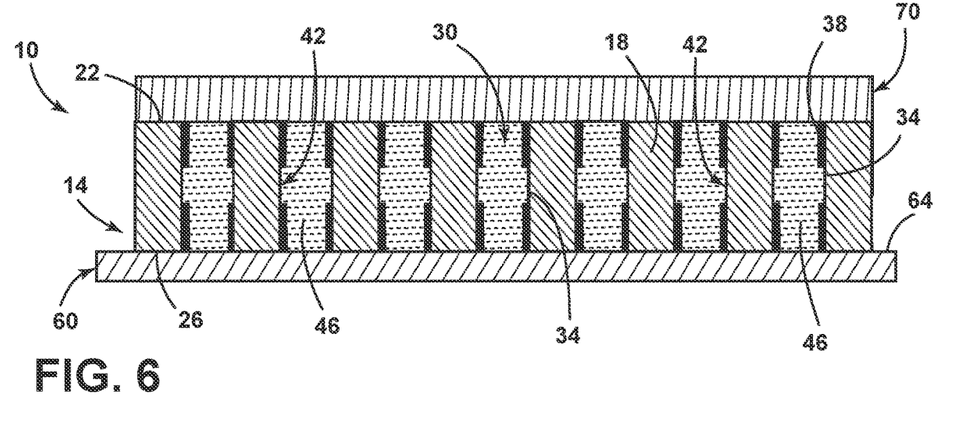
FIG. 6 is a cross-sectional view of the wafer with the vias fully metallized, according to at least one example.

Referring now to FIG. 6, once the vias 30 have been completely filled by the metallic component 46, the current is stopped and the electrolyte 70 is removed from the wafer 14. The mechanical force applied to the wafer 14 and/or the growth substrate 60 is removed, and the wafer 14 is separated from the growth substrate 60 leaving the metallic components 46 within the vias 30 intact. The separation may occur using a slight mechanical force (i.e., pulling the wafer 14 apart from the growth substrate 60). Additionally or alternatively, heat or ultrasonic waves may be applied to separate the metallic components 46 and the growth substrate 60. Further, the wafer 14 and the growth substrate 60 may be separated by immersing the wafer 14 and the growth substrate 60 in water (e.g., deionized water).

According to various examples, the wafer 14, including the vias 30 filled with the metallic components 46, may be cleaned once separated from the growth substrate 60. For example, the wafer 14 may be cleaned by rinsing with deionized water or other appropriate solutions to remove residual electrolyte 70. The wafer 14 may optionally be dried by flowing a stream of nitrogen or other inert gas onto the wafer 14. The wafer 14 may be cleaned and dried while still in contact with the growth substrate 60 or after separation from the growth substrate 60.

Figure 7:
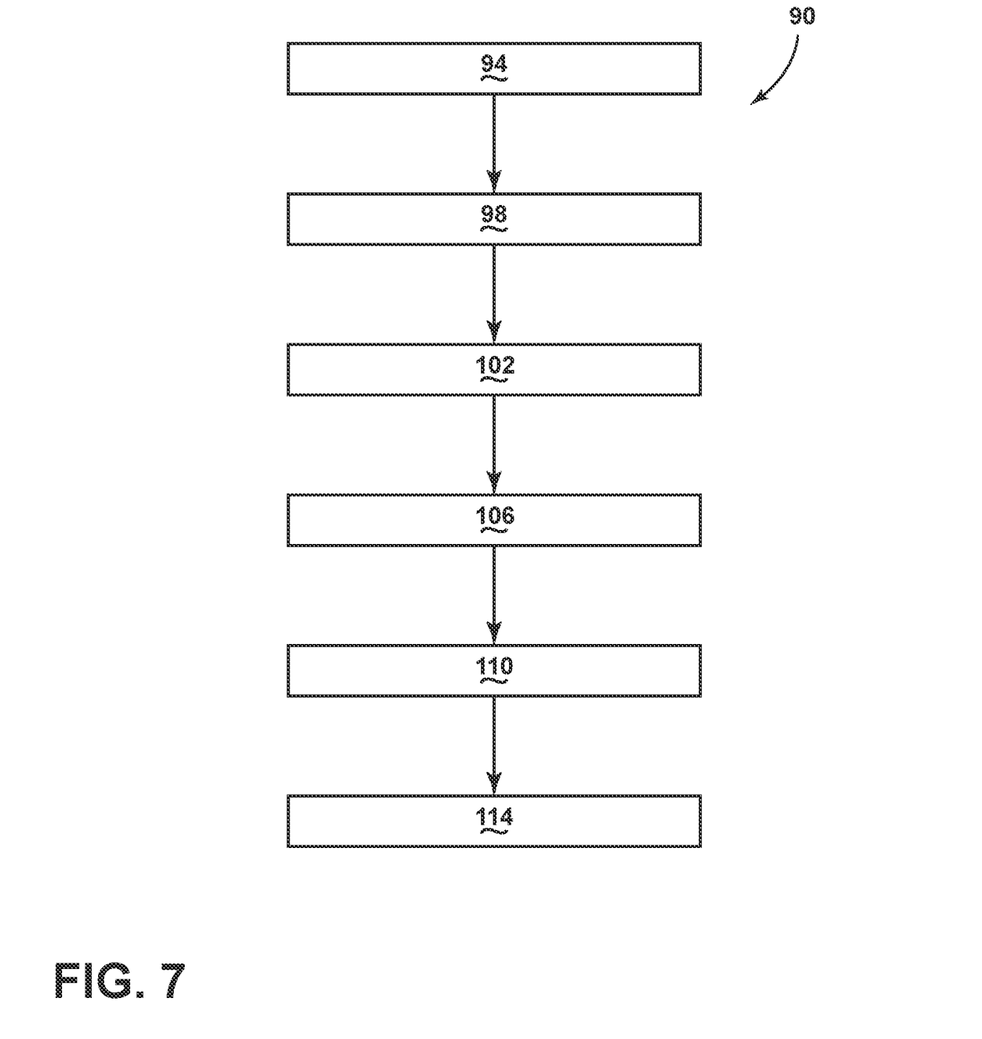
FIG. 7 is a flowchart of an exemplary method for forming the article.

Referring now to FIG. 7, depicted is a method 90 of forming the metallized article 10. It will be understood that although the method 90 is described and shown as including a number of steps in a specific order, the method 90 may be practiced in any order and may include other steps or omit described steps without departing from the teachings provided herein. The method 90 may begin with a step 94 of forming the via 30 through the body 18 of the glass wafer 14 such that the via 30 has the via surface 34. As explained above, the glass examples of the wafer 14 may be manufactured or processed in a variety of manners such that the glass may be strengthened or strong. The vias 30 may be formed using a laser or any other method to form a damage channel or hole within the body 18 which later may be etched as described above. The via 30 may have an aspect ratio of from about 1:1 to about 30:1. For example, step 94 may include forming the via 30 with an aspect ratio of about 4:1 or greater.

Next, a step 98 of applying the adhesion layer 38 to the via surface 34 such that the portion 42 of the via surface 34 is free of the adhesion layer 38 is performed. As explained above, application of the adhesion layer 38 may be performed via PVD, CVD and/or through solution coating methods. According to a specific example, step 98 may be carried out by sputtering at least one of Ta, Ti, Cr, V, Zr, W, Fe, Sn, Zn, In and Al on the via surface 34 to form the adhesion layer 38. The adhesion layer 38 may be applied to the via surface 34 in a variety of patterns which create the portion 42. For example, the adhesion layer 38 may be applied to the via surface 34 in a discontinuous manner which may create a plurality of adhesion layers 38 and/or a plurality of portions 42 of the via surface 34 which are free of the adhesion layer 38. As such, step 98 may be carried out by applying the adhesion layer 38 to the via surface 34 as a plurality of adhesion layers 38. According to various examples, the adhesion layer 38 may also be applied to a surface (e.g., the first and/or second surfaces 22, 26) of the wafer 14. The adhesion layer 38 may actively be applied to the first and/or second surfaces 22, 26 or may be a result of the manner in which the adhesion layer 38 is applied to the via surface 34.

In examples where the adhesion layer 38 is applied to the first and/or second surfaces 22, 26 of the wafer 14, a step 102 of removing the adhesion layer 38 present on the surface (e.g., the first and/or second surface 22, 26) of the wafer 14 prior to a step of depositing a metal within the via 30 may be performed. In examples where the first and/or second surfaces 22, 26 includes the adhesion layer 38, it may be advantageous to remove the adhesion layer 38, or polish the wafer 14, prior to the formation of the metallic component 46. For example, removing the adhesion layer 38 present on the first and/or second surfaces 22, 26 of the wafer 14 may be advantageous in preventing contamination of the metallic component 46 within the via 30. For example, as the adhesion layer 38 is not removed from of the wafer 14 while the metallic component 46 is present (i.e., hasn't been formed yet), cross-contamination of the metallic component 46 may be avoided.

Next, a step 106 of contacting the wafer with a metal substrate 60 may be performed. As explained above, the growth substrate 60 is applied to the second surface 26 of the wafer 14. The addition of the substrate 60 seals one end of the vias 30 such that a step 110 of filling the via 30 with the electrolyte 70 may be performed. As explained above, filling of the vias 30 with the electrolyte 70 may be done in a tank (i.e., the whole wafer 14 is submerged). It will be understood that other methods of filling the vias 30 with the electrolyte 70 are contemplated.

Next, a step 114 of depositing a metal within the vias 30 in contact with both the via surfaces 34 and the adhesion layers 38 may be performed. As explained above, the wafer 14 may undergo a metallization or electroplating process to deposit metal within the via 30 in the form of the metallic component 46. Step 114 may be accomplished by applying a voltage between the substrate 60 and an electrode in electrical communication with the electrolyte 70 to deposit metal ions present in the electrolyte 70 in the vias 30. As explained above, the metal preferentially grows, or is deposited, in the vias 30 such that the vias 30 act as a guide to form the metallic component 46. As the metallic component 46 is deposited, it forms in contact with the adhesion layer 38 and the portions 42 of the via surface 34 which are free of the adhesion layer 38. In other words, the metallic component 46 is coupled to both the adhesion layer 38 and the via surface 34.

Use of the present disclosure may offer a variety of advantages. First, using the presently disclosed processes may allow for the wafer 14 to be composed of a broad material set, with a wide range of properties driven by composition. For example, controlling compositional changes allow tailoring of various properties of the article 10 such as mechanical, thermal, electrical, optical, and even chemical durability characteristics. Compared to traditional articles 10 which include a substrate formed of silicon, glass examples of the wafer 14 of the present disclosure offer the ability to alter the coefficient of thermal expansion (CTE) thereby making glass a promising material for different applications where stack warpage due to CTE mismatch presents a significant reliability concern. Second, glass examples of the wafer 14, as compared to conventional silicon examples, are an inherent insulator. The inherent insulator property of glass wafers 14 is useful for Cu interconnects because no dielectric layer is required before the Cu plating/filling process to achieve low-level leakage current. Third, the present disclosure has a wide range of applications in consumer electronics, high-performance processors, microelectromechanical devices (MEMS), touch sensors, biomedical devices, high-capacity memories, automotive electronics and aerospace components. Fourth, manufacturing complexity and cost may be reduced relative to conventional designs as a seed layer is not required to form the metallic component 46. Fifth, as a seed layer is not required to form the metallic component 46, the adhesion layer 38 does not need to be continuous and as such higher aspect ratio vias 30 may be formed relative to conventional designs.

Clause 1 of the present disclosure extends to:
An article, comprising:
a wafer having a body which defines a first surface and a second surface, wherein the wafer defines a via having a via surface extending between the first and second surfaces through the body;
an adhesion layer positioned on the via surface, wherein at least a portion of the via surface is free of the adhesion layer; and
a metallic component positioned within the via and extending from the first surface to the second surface.

Clause 2 of the present disclosure extends to:
The article of clause 1, wherein the wafer comprises a glass, glass-ceramic or ceramic material.

Clause 3 of the present disclosure extends to:
The article of clause 1 or 2, wherein the metallic component is coupled with the adhesion layer and the portion of the via surface which is free of the adhesion layer.

Clause 4 of the present disclosure extends to:
The article of any of clauses 1-3, wherein the adhesion layer has a thickness of from about 1 nm to about 500 nm.

Clause 5 of the present disclosure extends to:
The article of clause 4, wherein the adhesion layer has a thickness of from about 40 nm to about 100 nm.

Clause 6 of the present disclosure extends to:
The article of any of clauses 1-5, wherein the adhesion layer comprises at least one of Ta, Ti, Cr, V, Zr, Mn, W, Fe, Sn, Zn, In and Al.

Clause 7 of the present disclosure extends to:
The article of any of clauses 1-6, wherein an aspect ratio of the via is about 2:1 or greater.

Clause 8 of the present disclosure extends to:
The article of clause 7, wherein the aspect ratio of the via is about 15:1 or greater.

Clause 9 of the present disclosure extends to:
The article of any of clauses 1-8, wherein the metallic component fills the via.

Clause 10 of the present disclosure extends to:
A glass article, comprising:
a wafer having a body which defines a first surface and a second surface, wherein the wafer defines a via having a via surface extending between the first and second surfaces through the body;
an adhesion layer positioned on the via surface, wherein the adhesion layer is disposed on the via surface in a discontinuous manner; and
a metallic component positioned within the via and extending from the first surface to the second surface.

Clause 11 of the present disclosure extends to:
The article of clause 10, wherein the metallic component comprises copper.

Clause 12 of the present disclosure extends to:
The article of clause 10 or 11, wherein the article is free of a seed layer.

Clause 13 of the present disclosure extends to:
The article of any of clauses 10-12, wherein the via has a diameter of from about 5 µm to about 200 µm.

Clause 14 of the present disclosure extends to:
The article of any of clauses 10-13, wherein a central region of the via surface is free of the adhesion layer.

Clause 15 of the present disclosure extends to:
A method of forming a metallized article, comprising the steps:
forming a via through a body of a glass wafer such that the via has a via surface;
applying an adhesion layer to the via surface such that a portion of the via surface is free of the adhesion layer; and
depositing a metal within the via in contact with the via surface and the adhesion layer.

Clause 16 of the present disclosure extends to:
The method of clause 15, further comprising the steps:
  contacting the wafer with a metal substrate; and
  filling the via with an electrolyte solution.
Clause 17 of the present disclosure extends to:
The method of clause 15 or 16, wherein the step of depositing a metal within the via further comprises the step of:
  applying a voltage or current between the substrate and an electrode in electrical communication with the electrolyte to deposit the metal.
Clause 18 of the present disclosure extends to:
The method of any of clauses 15-17, wherein the step of applying the adhesion layer further comprises:
  sputtering at least one of Ta, Ti, Cr, V, Zr, Mn, W, Fe, Sn, Zn, In and Al on the via surface.
Clause 19 of the present disclosure extends to:
The method of any of clauses 15-18, wherein the step of forming the via further comprises:
  forming the via with an aspect ratio of about 4:1 or greater.
Clause 20 of the present disclosure extends to:
The method of any of clauses 15-19, wherein the step of applying the adhesion layer further comprises:
  applying the adhesion layer to the via surface as a plurality of adhesion layers.
Clause 21 of the present disclosure extends to:
The method of any of clauses 15-20, further comprising the steps:
  applying the adhesion layer to a surface of the wafer; and
  removing the adhesion layer present on the surface of the wafer prior to the step of depositing the metal within the vias.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

What is claimed is:

1. An article, comprising:
  a wafer having a body that defines a first surface and a second surface, wherein the body defines a via having a via surface extending between the first and second surfaces through the body;
  a plurality of adhesion layers adhered directly to the body defining the via surface, the plurality of adhesion layers comprising a first adhesion layer, a second adhesion layer, and a third adhesion layer that are applied in a discontinuous manner such that the via surface is free of the adhesion layers between the first adhesion layer and the second adhesion layer and between the second adhesion layer and the third adhesion layer, wherein at least 15% of the via surface is free of the adhesion layers; and
  a metallic component positioned within the via and filling a diameter of the via between the first and second surfaces,
  wherein the metallic component is in direct contact with the adhesion layers and the via surface that is free of the adhesion layers.

2. The article of claim 1, wherein the wafer comprises a glass, glass-ceramic or ceramic material.

3. The article of claim 1, wherein the plurality of adhesion layers each have a thickness of from 1 nm to 500 nm.

4. The article of claim 1, wherein at least 25% of the via surface is free of the adhesion layers.

5. The article of claim 1, wherein the adhesion layers comprise at least one of Ta, Ti, Cr, V, Zr, Mn, W, Fe, Sn, Zn, In and Al.

6. The article of claim 1, wherein an aspect ratio of the via is 2:1 or greater.

7. The article of claim 6, wherein the aspect ratio of the via is 15:1 or greater.

8. The article of claim 1, wherein the metallic component fills the via.

9. An article, comprising:
  a wafer having a body that defines a first surface and a second surface, wherein the body defines a via having a via surface extending between the first and second surfaces through the body;
  a plurality of adhesion layers adhered directly to the body defining the via surface, wherein the plurality of adhesion layers are disposed on the via surface in a discontinuous manner such that at least a first portion and a second portion of the via surface are free of the adhesion layers, the first portion and the second portion being separated by at least one of the plurality of adhesion layers, wherein at least 15% of the via surface is free of the adhesion layers; and
  a metallic component positioned within the via, wherein the metallic component is in direct contact with the adhesion layers and the first and second portions of the via surface, and
  wherein the plurality of adhesion layers provides a mechanical lock between the metallic component and the via surface.

10. The article of claim 9, wherein the metallic component comprises copper.

11. The article of claim 9, wherein the article is free of a seed layer.

12. The article of claim 9, wherein the via has a diameter of from 5 μm to 200 μm.

13. The article of claim 9, wherein the first portion of the via surface that is free of the plurality of adhesion layers comprises a central region of the via surface.

14. The article of claim 9, wherein the metallic component fills the via.

15. An article, comprising:
- a wafer having a body that defines a first surface and a second surface, wherein the body defines a via having a via surface extending between the first and second surfaces through the body;
- a plurality of adhesion layers adhered directly to the body defining the via surface, the plurality of adhesion layers comprising a first adhesion layer, a second adhesion layer, and a third adhesion layer that are applied in a discontinuous manner such that the via surface is free of the adhesion layers between the first adhesion layer and the second adhesion layer and between the second adhesion layer and the third adhesion layer, wherein at least 10% of the via surface is free of the adhesion layers; and
- a metallic component positioned within the via, wherein the metallic component is in direct contact with the adhesion layers and the via surface that is free of the adhesion layers,
- wherein the via is free of an electrically conductive seed layer between the via surface and the metallic component.

16. The article of claim 15, wherein the wafer comprises a glass, glass-ceramic or ceramic material.

17. The article of claim 15, wherein the plurality of adhesion layers each have thickness of from 1 nm to 500 nm.

18. The article of claim 15, wherein the adhesion layers comprise at least one of Ta, Ti, Cr, V, Zr, Mn, W, Fe, Sn, Zn, In and Al.

19. The article of claim 15, wherein an aspect ratio of the via is 2:1 or greater.

20. The article of claim 15, wherein the aspect ratio of the via is 15:1 or greater.

21. The article of claim 15, wherein the metallic component fills the via.

* * * * *

UNITED STATES PATENT AND TRADEMARK OFFICE
CERTIFICATE OF CORRECTION

PATENT NO. : 10,917,966 B2
APPLICATION NO. : 16/245793
DATED : February 9, 2021
INVENTOR(S) : Shrisudersan Jayaraman It is certified that error appears in the above-identified patent and that said Letters Patent is hereby corrected as shown below:

On the Title Page

On page 2, in Column 1, item (56), U.S. Patent Documents, Line 11, below "Shen" insert -- 9190356 11/2015 Ebefors et al. --.

On page 2, in Column 2, item (56), Other Publications, Line 6, delete "Interconnectons" and insert -- Interconnections --, therefor.

On page 2, in Column 2, item (56), Other Publications, Line 20, delete "Metallis" and insert -- Metallic --, therefor.

On page 2, in Column 2, item (56), Other Publications, Line 22, delete "(1990." and insert -- (1990). --, therefor.

On page 2, in Column 2, item (56), Other Publications, Line 32, delete "(2013." and insert -- (2013). --, therefor.

On page 2, in Column 2, item (56), Other Publications, Line 33, delete "Electorplating" and insert -- Electroplating --, therefor.

On page 2, in Column 2, item (56), Other Publications, Line 34, delete "Micromach." and insert -- Micromech. --, therefor.

On page 2, in Column 2, item (56), Other Publications, Line 38, delete "(2013." and insert -- (2013). --, therefor.

On page 2, in Column 2, item (56), Other Publications, Line 42, delete "(2015." and insert -- (2015). --, therefor.

On page 2, in Column 2, item (56), Other Publications, Line 53, delete "Chemisty" and insert Signed and Sealed this
Twenty-first Day of September, 2021

Drew Hirshfeld
*Performing the Functions and Duties of the
Under Secretary of Commerce for Intellectual Property and
Director of the United States Patent and Trademark Office*

-- Chemistry --, therefor.

On page 2, in Column 2, item (56), Other Publications, Line 60, delete "(2013." and insert -- (2013). --, therefor.

In the Claims

In Column 18, Line 10 (approx.), Claim 17, delete "thickness" and insert -- a thickness --, therefor.